United States Patent [19]

Jerrim

[11] 4,327,416

[45] Apr. 27, 1982

[54] TEMPERATURE COMPENSATION SYSTEM FOR HALL EFFECT ELEMENT

[75] Inventor: John W. Jerrim, Lilburn, Ga.

[73] Assignee: Sangamo Weston, Inc., Norcross, Ga.

[21] Appl. No.: 140,954

[22] Filed: Apr. 16, 1980

[51] Int. Cl.³ ............................................. G01R 33/06
[52] U.S. Cl. .................................... 364/481; 364/557; 324/117 H; 324/251
[58] Field of Search ............... 364/481, 557, 571, 579; 73/DIG. 3; 324/77 R, 251, 117 H

[56] References Cited

U.S. PATENT DOCUMENTS

| | | | |
|---|---|---|---|
| 3,635,297 | 1/1972 | Salava | 364/466 X |
| 3,886,446 | 5/1975 | Laranov et al. | 324/251 |
| 4,099,238 | 7/1978 | Suzuki | 364/481 |
| 4,161,782 | 7/1979 | McCracken | 364/571 |
| 4,162,531 | 7/1979 | Rode et al. | 364/571 |
| 4,198,677 | 4/1980 | Brunner et al. | 364/571 |
| 4,217,651 | 8/1980 | Pickering | 364/571 |

Primary Examiner—Edward J. Wise
Attorney, Agent, or Firm—Mikio Ishimaru; Dale Gaudier

[57] ABSTRACT

In a solid state current, power or energy meter having a Hall element magnetically coupled to line current, a system for compensating the Hall voltage for its dependence on temperature comprises a read only memory (ROM) containing experimentally obtained temperature compensation data. The temperature of the Hall element is measured by a thermistor to develop a temperature dependent voltage. In one embodiment, the Hall element voltage and temperature dependent voltage are digitalized and supplied to address the ROM to generate a temperature compensated Hall voltage. In a second embodiment, the ROM is addressed by only the temperature dependent voltage to generate a correction voltage that is added to the Hall element voltage for temperature compensation.

18 Claims, 6 Drawing Figures

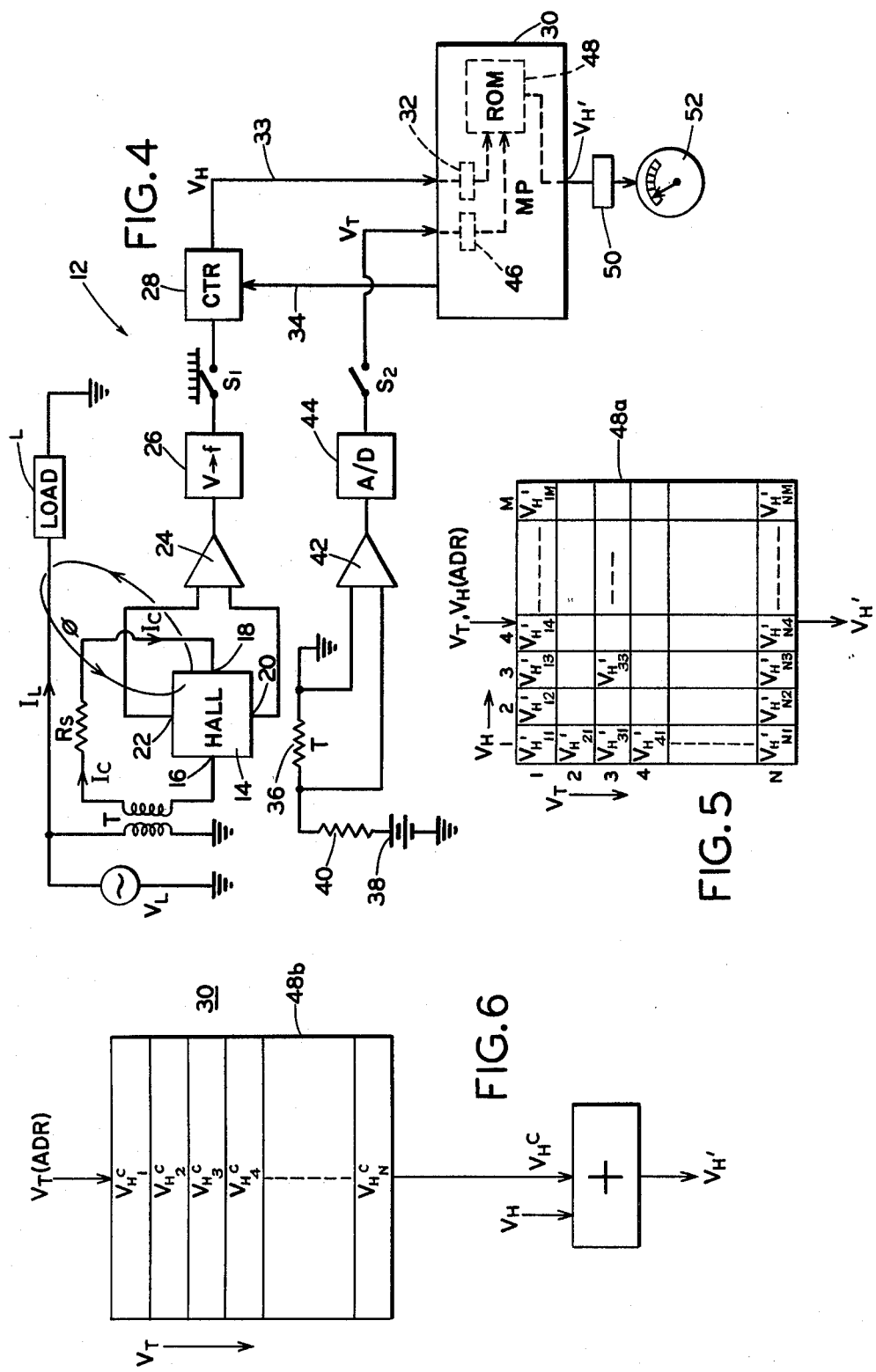

TEMPERATURE COMPENSATION SYSTEM FOR HALL EFFECT ELEMENT

TECHNICAL FIELD

The present invention relates generally to magnetic field measurement using a Hall element and more particularly toward a Hall element based current, power or energy meter wherein temperature compensation data are stored in a read only memory that is addressed as a function of at least the Hall element temperature.

BACKGROUND ART

Meters using a Hall element magnetically coupled to a line current to generate an output voltage proportional to the instantaneous current, power or energy or other magnetic flux dependent parameter have been in existence for several years. These meters operate with good accuracy over only a limited temperature range, however, due to the high dependence of the Hall element output voltage on temperature. With reference to FIG. 1, measurement of the flux density B of a magnetic field associated with line current $I_L$ is made by applying a control current $I_C$ to the Hall element 10 and exposing the element to the magnetic field. A Hall voltage $V_H$ is developed across the output terminals of element 10 which are disposed at right angles to the flow direction of the control current. The flux density B of the field is determined from the Hall voltage $V_H$ on the basis of a predetermined mathematical relationship between the two parameters. A more detailed discussion of the theory underlying the Hall effect is found in Section 5.2 of Runyan, *Semiconductor Measurements and Instrumentation*, Texas Instruments Electronic Series, McGraw-Hill Book Company, 1975.

The Hall voltage $V_H$ of Hall element 10 can be defined by $V_H = K(T)I_C B$, wherein K(T) represents a temperature coefficient which depends upon the configuration of the Hall element, temperature and the like, $I_C$ represents the control current and B represents the flux density passing through the element in a direction perpendicular to the element plane.

The power in watts dissipated in a circuit is P=V (volts)×I (amperes). Assuming that the control current $I_C$ applied to the Hall element is proportional to the line voltage ($I_C \alpha V_L$), and since flux density B is proportional to line current ($B \alpha I_L$), Hall voltage $V_H$ is proportional to power. This relationship can be better understood from an analysis of the basic power and Hall voltage equations:

$$P_L = I_L V_L \quad (1)$$

where:
$P_L$ is line power,
$I_L$ is line current, and
$V_L$ is line voltage; and $$V_H = K(T)I_C B \quad (2)$$

where:
$V_H$ is Hall voltage,
K(T) is a temperature dependent constant,
$I_C$ is control current, and
B is magnetic flux density;
Since:

$$B = K_1 I_L \quad (3)$$

and $$I_C = K_2 V_L \quad (4)$$

combining equations (2), (3) and (4) yields:

$$V_H = K(T)K_1 K_2 I_L V_L \quad (5)$$

or $$V_H = K P_L \quad (6)$$

where:
$K = K(T)K_1 K_2$.

Line power is thus determined by exposing the Hall element to magnetic flux developed by line current while obtaining the Hall element control current from the line voltage. Similarly, line energy can be measured by integrating the Hall element voltage. Line current is typically determined by measuring Hall voltage while maintaining the control current $I_C$ constant.

As shown in FIG. 2, whereas the relationship between Hall voltage $V_H$ and magnetic flux density B is fairly linear at a fixed temperature T, FIG. 3 illustrates that the Hall voltage varies substantially as a function of temperature. The temperature of the Hall element in an operating environment is unpredictable since it is a function of ambient temperature and also of the magnitude of control current flowing through the element. The variation of Hall voltage with temperature at constant flux density is unacceptable in high accuracy power, energy or current measurement systems since this factor introduces error into any reading made at a temperature different from a reference or calibration temperature.

It is an object of the invention, therefore, to provide a system for compensating a Hall effect element for its dependency on temperature.

In Suzuki U.S. Pat. No. 4,099,238, the Hall voltage and a temperature dependent voltage are supplied to an analog calculation circuit which generates a temperature compensated signal proportional to magnetic flux density. The circuit solves an equation that involves a series approximation of a nonlinear relationship between Hall voltage and temperature. Because the equation is based on an approximation, there is error in the resultant flux density dependent signal. Also, since the circuit operates in the analog domain, it requires relatively expensive analog components such as multipliers, adders and subtractors. The number and cost of these components increase as the accuracy of the approximation on which the equation is based is increased. As another disadvantage, the circuit lacks versatility because the coefficients of the equation must be changed for each Hall element.

A further object of the invention, therefore, is to provide a temperature compensation system for a Hall element that is more accurate and less costly than the analog systems of the prior art.

An additional object of the invention is to provide a temperature compensation system for a Hall element that can be tailored to be operative with different elements.

DISCLOSURE OF INVENTION

A device for measuring a parameter associated with a magnetic field generated by a line current, such as current, power or energy, comprises a Hall element connected to generate a voltage corresponding to the density of the magnetic flux to which the element is exposed. The temperature of the Hall element is measured by a thermistor to develop a Hall element temperature dependent voltage. In one embodiment, the temperature dependent voltage is digitalized and supplied as an address to the input of a read only memory having storage locations containing temperature compensation signal data corresponding to Hall element temperatures. The temperature compensation signal generated by the read only memory is combined with the Hall voltage to provide a temperature compensated Hall voltage to be displayed on a meter calibrated in accordance with the parameter being measured.

In a second embodiment, the read only memory contains Hall voltage compensation data as a function of Hall voltage as well as temperature. The Hall element voltage and temperature dependent voltage are digitalized and applied to address the read only memory. The signal generated by the read only memory is a temperature compensated Hall voltage corresponding to the measured Hall voltage and temperature.

Still other objects and advantages of the present invention will become readily apparent to those skilled in this art from the following detailed description, wherein I have shown and described only the preferred embodiments of the invention, simply by way of illustration of the best modes contemplated by me of carrying out my invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIG. 4 is a schematic diagram of a circuit for generating a temperature compensated Hall voltage $V_{H'}$ proportional to line current, power or energy for display, in accordance with one embodiment of the invention;

FIG. 5 is a diagrammatic representation of a read only memory applied in the circuit of FIG. 4; and FIG. 6 is a partial schematic diagram of a second circuit for generating the temperature compensated Hall voltage $V_{H'}$.

BEST MODE FOR CARRYING OUT THE INVENTION

Figure 1:
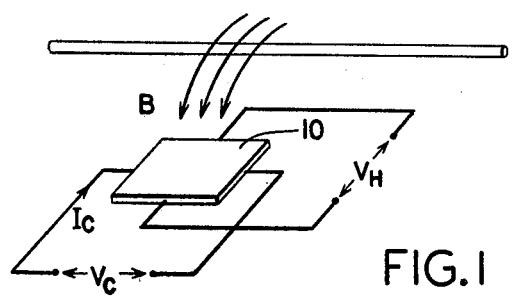
FIG. 1 is a schematic view of a typical Hall element exposed to a magnetic field developed by a line current.
Figure 2:
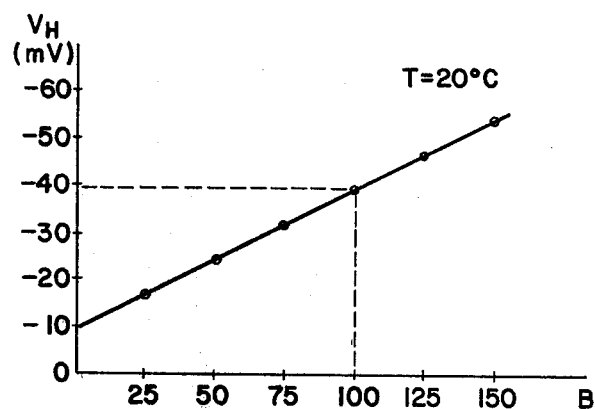
FIG. 2 is a graph showing the relationship between Hall voltage $V_H$ and flux density B at a constant temperature.
Figure 3:
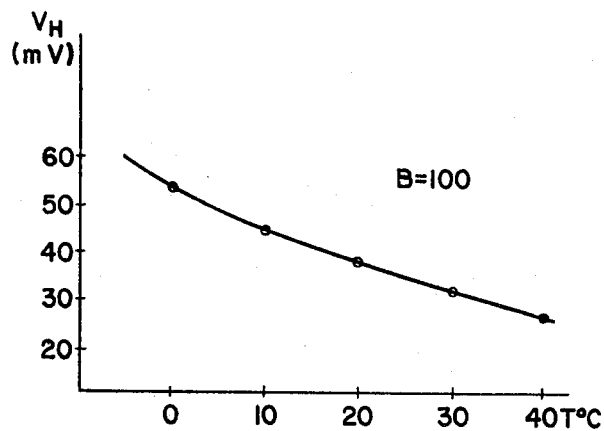
FIG. 3 is a graph showing the relationship between Hall voltage $V_H$ and temperature at a constant flux density.

Referring to FIG. 4, a circuit 12 for measuring current, power or energy supplied to a load L by a voltage source $V_L$ includes a Hall element 14, exposed to the magnetic flux developed by line current $I_L$. A control current $I_C$ obtained from the line voltage source $V_L$ through transformer T and resistor $R_S$ is applied to control terminals 16 and 18 of the Hall element 14. The Hall voltage $V_H$ generated at output terminals 20 and 22 is thus proportional to the power supplied to load L. This output voltage is amplified in differential amplifier 24 to increase the magnitude of the low level Hall voltage (typically on the order of 10's of millivolts) to a level on the order of volts. The output of amplifier 24 is supplied to a conventional voltage-to-pulse repetition rate converter 26 that generates a pulse train as shown in the Figure having a repetition rate proportional to the magnitude of the Hall voltage. The repetition rate of the pulse train is measured by a counter 28 that samples through sampling switch $S_1$ the pulse train for predetermined, fixed time periods controlled through line 34 by microprocessor 30 and stores the pulse count accumulated during the sample period. At the end of each sample period, the new pulse count is compared with the pulse count of the immediately preceding sample period. The pulse count difference is generated by counter 28 on line 33 and stored in register 32 of the microprocessor 30. The count stored in register 32 is a digital representation of the instantaneous Hall voltage $V_H$ which is proportional to power.

If the parameter to be measured is current rather than power, the control current $I_C$ applied to the Hall element 14 is supplied by a constant voltage source (not shown) rather than derived from the line voltage $V_L$ through transformer T.

The temperature of Hall element 14 is measured by a thermistor 36 positioned in thermal contact with the Hall element 14 such that the temperature of the thermistor tracks the temperature of the Hall element. Thermistor 36 forms one leg of a voltage divider circuit energized by a voltage source 38; the remaining leg of the divider circuit contains a resistor 40. The voltage developed across thermistor 36 is applied to differential amplifier 42 which functions as a buffer to supply the temperature dependent voltage obtained from the thermistor to a conventional analog-to-digital converter 44.

The output of converter 44 in the form of a digital representation of Hall element temperature $V_T$ is sampled by microprocessor 30 through sampling switch $S_2$ for storage in register 46. The sampling rate applied by microprocessor 30 to the temperature dependent voltage $V_T$ is preferably equal to the rate applied to Hall voltage $V_H$. In some applications, however, such as those wherein temperature is relatively constant, the temperature dependent voltage $V_T$ may be sampled at a rate lower than the sampling rate of the Hall voltage $V_H$ to reduce the amount of data processing by the microprocessor 30. In such applications, the temperature dependent voltage samples $V_T$ are stored in register 46 during the higher rate sampling of Hall voltage $V_H$.

The output signals of registers 32 and 46 are digital representations, respectively, of the Hall voltage and temperature dependent voltage. These signals are combined and supplied as an address to read only memory (ROM) 48 having storage locations containing temperature compensation data associated with the Hall element 14 as a function of Hall voltage and temperature. In applications wherein the Hall voltage sampling rate is greater than the temperature dependent voltage sampling rate, the Hall voltage address component is updated more frequently than the temperature dependent voltage address component is. Alternatively, the signals stored in registers 32 and 46 may be supplied directly to address the ROM 48 without combination thereof depending upon the particular addressing strategy used. For example, the Hall voltage address may define a particular portion of the ROM 48 with the temperature dependent voltage address defining a storage location within that memory portion.

Referring to FIG. 5, read only memory 48 is in the form of a ROM 48a or other non-volatile storage device such as a programmable ROM (PROM), an erasable PROM (EPROM) or electrically erasable PROM (EEPROM) having a two-dimensional (N×M) array of storage locations each containing a compensated Hall voltage value $V_{H'}$ corresponding to a particular Hall voltage and Hall element temperature. Each storage location corresponds to a unique address formed by the combination of the digital Hall voltage $V_H$ stored in register 32 and digital temperature dependent voltage $V_T$ stored in register 46. In the particular addressing strategy shown in FIG. 5, storage location columns are defined by the Hall voltage address component $V_H$ whereas storage location rows are defined by the temperature dependent voltage address component $V_T$. Thus, each combination of $V_T$ and $V_H$ has associated with it a unique storage location defined by the intersection of the corresponding row and column.

The output $V_{H'}$ of read only memory 48 within microprocessor 30 is supplied to a signal conversion circuit 50, which may be provided by external circuitry, as shown, or alternatively by software within the microprocessor, that converts the compensated Hall voltage to power or energy or other parameter of interest to be displayed on meter 52. If energy rather than power is the parameter being measured, circuit 50 integrates the output of ROM 48 prior to display in meter 52. For example, as shown in FIG. 5, the intersection of a row defined by temperature dependent voltage $V_{T3}$ and a column defined by Hall voltage $V_{H3}$ is $V_{H'33}$. The voltage $V_{H'33}$ generated by ROM 48a in response to the address is the compensated Hall voltage determined experimentally at those two parameter values for the particular Hall element 14.

It is apparent that the number of compensated Hall voltage values $V_{H'}$ stored in ROM 48 is limited only by the size of the memory, with (N×M) values of $V_{H'}$ being possible. The data array in ROM 48 is established experimentally for each type of Hall element 14 by measuring Hall voltage values throughout an operating voltage range at a reference temperature and repeating the voltage measurements at incremented temperature to provide the voltage and temperature data array.

Referring now to FIG. 6, a second embodiment of the invention is shown wherein the memory 48 in microprocessor 30 comprises ROM 48b having storage locations containing Hall voltage compensation data or error signals $V_{Hc}$ addressed by the digital temperature dependent signal $V_T$ stored in register 46 of the microprocessor. The output $V_{Hc}$ of ROM 48b, which is a function of only Hall element temperature, is added to the Hall voltage $V_H$ in adder 54. The signal generated by adder 54 is defined by the equation $H_{H'} = V_H + V_{Hc}$. Although the output $V_{H'}$ of adder 54 is only an approximation of the temperature compensated Hall voltage since compensation data are actually a function of Hall voltage as well as temperature rather than of temperature alone, the Hall voltage $V_{H'}$ generated by the circuit of FIG. 6 is sufficiently accurate for many applications and requires much less memory storage allocation than the two-dimensional storage array in memory 48a of FIG. 5 does. Again, if energy rather than line power is the parameter being measured, the output of adder 54 is integrated prior to display.

In this disclosure, there is shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. A device for measuring the density of a magnetic flux field, comprising a Hall element for generating an output voltage as a function of a Hall element control current and the flux density of the magnetic field to which the element is exposed, said output voltage also being a function of Hall element temperature, means for measuring the temperature of said Hall element, memory means having storage locations containing Hall voltage compensation data as a function of Hall element temperature; means responsive to said temperature measuring means for generating a Hall temperature dependent digital signal, means for applying said temperature dependent digital signal as an address to said memory means to generate a correction voltage corresponding to the Hall element temperature, and means for combining said correction voltage with said Hall element output voltage to provide a temperature compensated output voltage.

2. A device for measuring the density of a magnetic flux field, comprising a Hall element for generating an output signal as a function of a Hall element control current and the flux density of the magnetic field to which the Hall element is exposed, said output signal also being a function of Hall element temperature; means for measuring the temperature of said Hall element; means responsive to said temperature measuring means for generating a Hall element temperature dependent signal; means for digitalizing said temperature dependent signal and said Hall element output signal; memory means having storage locations containing compensated Hall voltage data as a function of Hall element output signal and Hall element temperature; and means for addressing said memory means with said digital Hall output and temperature dependent signals to generate a temperature compensated Hall element voltage.

3. The device of claim 1 or claim 2, including readout means for displaying said compensated Hall voltage.

4. A device for measuring a parameter associated with the magnetic flux generated by a line current, comprising a Hall element to be located in proximity to said line in exposure to said magnetic field, said Hall element being connected to generate a Hall voltage as a function of a Hall element control current and the magnitude of a magnetic field density of said magnetic field, said Hall voltage further being a function of temperature; means for measuring the temperature of said Hall element; means responsive to said temperature measuring means for generating a temperature dependent digital signal; memory means containing Hall voltage compensation data as a function of Hall element temperature; means for addressing said memory means with said temperature dependent digital signal to generate therefrom a correction voltage corresponding to Hall element temperature; means for combining said correction voltage with said Hall element voltage to provide a temperature compensated Hall voltage; means for converting said compensated voltage to a signal corresponding to said parameter; and means for supplying said parameter signal to an output means.

5. A device for measuring a parameter associated with magnetic flux generated by a line current, comprising a Hall element to be located in proximity to said line in exposure to said magnetic field, said Hall element being connected to generate a Hall voltage as a function of a Hall element control current and the magnetic flux density of the magnetic field, said Hall voltage further being a function of temperature; means for measuring the temperature of said Hall element; means responsive to said temperature measurement means for generating a temperature dependent digital signal; means for converting said Hall voltage to a Hall digital signal; memory means having storage locations containing temperature compensated Hall voltage data as a function of Hall element voltage and temperature; means for addressing said memory means with said digital Hall and temperature dependent signals to generate a temperature compensated Hall element voltage; means for converting said temperature compensated Hall voltage to a signal corresponding to said parameter; and means for supplying said parameter signal to an output means.

6. The device of any one of claims 1-5, wherein said temperature measuring means includes a thermistor in thermal contact with said Hall element.

7. The device of claim 6, wherein said temperature measuring means further includes means responsive to said thermistor for generating a temperature dependent voltage and converter means for converting said voltage to a digital signal.

8. The device of claim 2 or claim 5, including first means for sampling said Hall element output signal at a first sampling rate, second means for sampling said temperature dependent signal at a second sampling rate, means for storing said temperature dependent signal during sampling of said Hall element output signal and means for supplying said sampled signals to address said memory means.

9. The device of claim 8, wherein said first sampling means includes means responsive to said Hall element voltage for generating a pulse train having a repetition rate proportional to the magnitude of the Hall element voltage, means for counting pulses of said pulse train for predetermined time periods, and means for periodically accessing said pulse counting means to obtain an address for said memory means.

10. The device of claim 4 or claim 5, wherein said parameter is power.

11. The device of claim 4 or claim 5 wherein said parameter is energy.

12. The device of claim 4 or claim 5, wherein said parameter is current.

13. In a device for measuring a parameter associated with the magnetic flux generated by a line current using a Hall element connected to generate a Hall voltage as a function of a Hall element control current and of the density of said magnetic flux wherein the Hall voltage is further a function of Hall element temperature, a method of temperature compensating the Hall voltage comprising the steps of storing in storage locations of a memory means Hall voltage compensation data as a function of Hall element temperature; measuring Hall element temperature, and in response generating a temperature depedent voltage; addressing said memory means with said temperature dependent voltage to generate therefrom corresponding temperature compensation data; converting said generated temperature compensation data to a corresponding temperature compensation voltage; and combining said temperature compensation voltage with said Hall voltage to obtain the temperature compensated Hall voltage.

14. In a device for measuring a parameter associated with the magnetic flux generated by a line current using a Hall element connected to generate a Hall voltage as a function of a Hall element control current and of the density of said magnetic flux wherein the Hall voltage is further a function of Hall element temperature, a method of temperature compensating the Hall voltage comprising the steps of storing in storage locations of a memory means temperature compensated Hall voltage data as a function of Hall element voltage and temperature; measuring the temperature of said Hall element and in response generating a Hall element temperature dependent voltage; digitalizing said Hall voltage and said Hall element temperature dependent voltage; and addressing said memory means with said digitalized voltages to generate therefrom a corresponding temperature compensated Hall voltage.

15. The method of claim 13 or claim 14 including the step of converting said temperature compensated Hall voltage to a line current dependent output voltage.

16. The method of claim 15, including the step of displaying said output voltage.

17. The method of claim 13 or claim 14 including the step of converting said temperature compensated Hall voltage to a line power dependent output voltage.

18. The method of claim 13 or claim 14 including the step of converting said temperature compensated Hall voltage to a line energy dependent output voltage.

* * * * *

UNITED STATES PATENT AND TRADEMARK OFFICE
CERTIFICATE OF CORRECTION

PATENT NO. : 4,327,416
DATED : April 27, 1982
INVENTOR(S) : John W. Jerrim

It is certified that error appears in the above-identified patent and that said Letters Patent are hereby corrected as shown below:

Column 2, line 40, "compensing" should read -- compensating --.

Column 5, line 57, "$H_H{'}=V_H + V_{HC}$" should read -- "$V_H{'}=V_H + V_H{c}$" --.

Claim 13, column 8, line 14, "depedent" should read -- dependent --.

Signed and Sealed this

Twenty-ninth Day of June 1982

[SEAL]

Attest:

GERALD J. MOSSINGHOFF

Attesting Officer          Commissioner of Patents and Trademarks